US012566231B2

(12) United States Patent
Shirai et al.

(10) Patent No.: US 12,566,231 B2
(45) Date of Patent: Mar. 3, 2026

(54) MAGNETIC RESONANCE IMAGING APPARATUS AND METHOD OF SUPPORTING SETTING OF IMAGING CONDITION THEREOF

(71) Applicant: FUJIFILM Healthcare Corporation, Kashiwa (JP)

(72) Inventors: Toru Shirai, Chiba (JP); Yukio Kaneko, Chiba (JP); Yosuke Otake, Chiba (JP); Suguru Yokosawa, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 125 days.

(21) Appl. No.: 18/619,828

(22) Filed: Mar. 28, 2024

(65) Prior Publication Data

US 2024/0361413 A1 Oct. 31, 2024

(30) Foreign Application Priority Data

Apr. 28, 2023 (JP) ................................ 2023-074679

(51) Int. Cl.
*G01R 33/561* (2006.01)
*G01R 33/36* (2006.01)
*G01R 33/54* (2006.01)

(52) U.S. Cl.
CPC ...... *G01R 33/5611* (2013.01); *G01R 33/3664* (2013.01); *G01R 33/546* (2013.01)

(58) Field of Classification Search
CPC ............ G01R 33/5611; G01R 33/3664; G01R 33/546
See application file for complete search history.

(56) References Cited

U.S. PATENT DOCUMENTS

| | | | |
|---|---|---|---|
| 7,102,351 B2 * | 9/2006 | Machida | G01R 33/5611 |
| | | | 324/309 |
| 8,918,159 B2 * | 12/2014 | Riederer | A61B 5/748 |
| | | | 600/420 |
| 11,119,175 B2 * | 9/2021 | Gao | G01R 33/5616 |
| 11,686,801 B2 * | 6/2023 | Kurokawa | G01R 33/5611 |
| | | | 324/309 |
| 12,029,544 B2 * | 7/2024 | Carinci | G01R 33/56563 |
| 2024/0175952 A1 * | 5/2024 | Ding | G01R 33/5614 |

FOREIGN PATENT DOCUMENTS

JP        4945585 B        6/2012

* cited by examiner

*Primary Examiner* — Reena Aurora
(74) *Attorney, Agent, or Firm* — Paul Teng

(57) ABSTRACT

Provided is an MRI apparatus that supports re-setting of an imaging condition for preventing occurrence of aliasing in a phase encoding direction. A region in which an aliasing signal causing aliasing occurs is estimated by using a FOV set at the beginning and a positioning image, a range of the FOV to be changed or a weighting amount of each channel of a reception coil is calculated based on an estimation result, and an imaging condition is changed. Thereafter, a main scan is executed, and in a case where a weight of the reception coil is changed, channel combination is performed using the changed weight.

18 Claims, 10 Drawing Sheets

FIG. 2

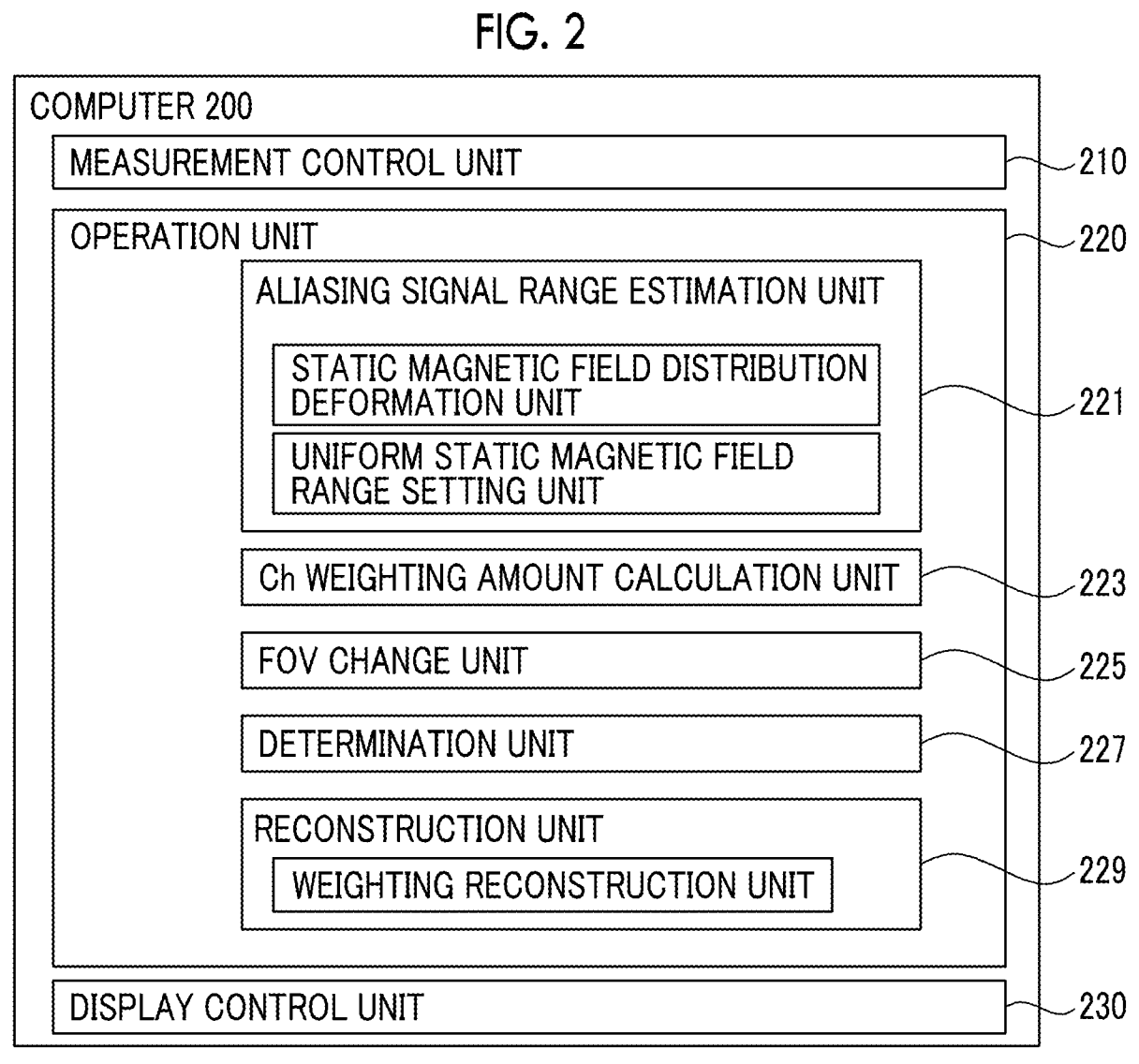

COMPUTER 200

MEASUREMENT CONTROL UNIT — 210

OPERATION UNIT — 220

ALIASING SIGNAL RANGE ESTIMATION UNIT — 221

STATIC MAGNETIC FIELD DISTRIBUTION DEFORMATION UNIT

UNIFORM STATIC MAGNETIC FIELD RANGE SETTING UNIT

Ch WEIGHTING AMOUNT CALCULATION UNIT — 223

FOV CHANGE UNIT — 225

DETERMINATION UNIT — 227

RECONSTRUCTION UNIT — 229

WEIGHTING RECONSTRUCTION UNIT

DISPLAY CONTROL UNIT — 230

FIG. 7

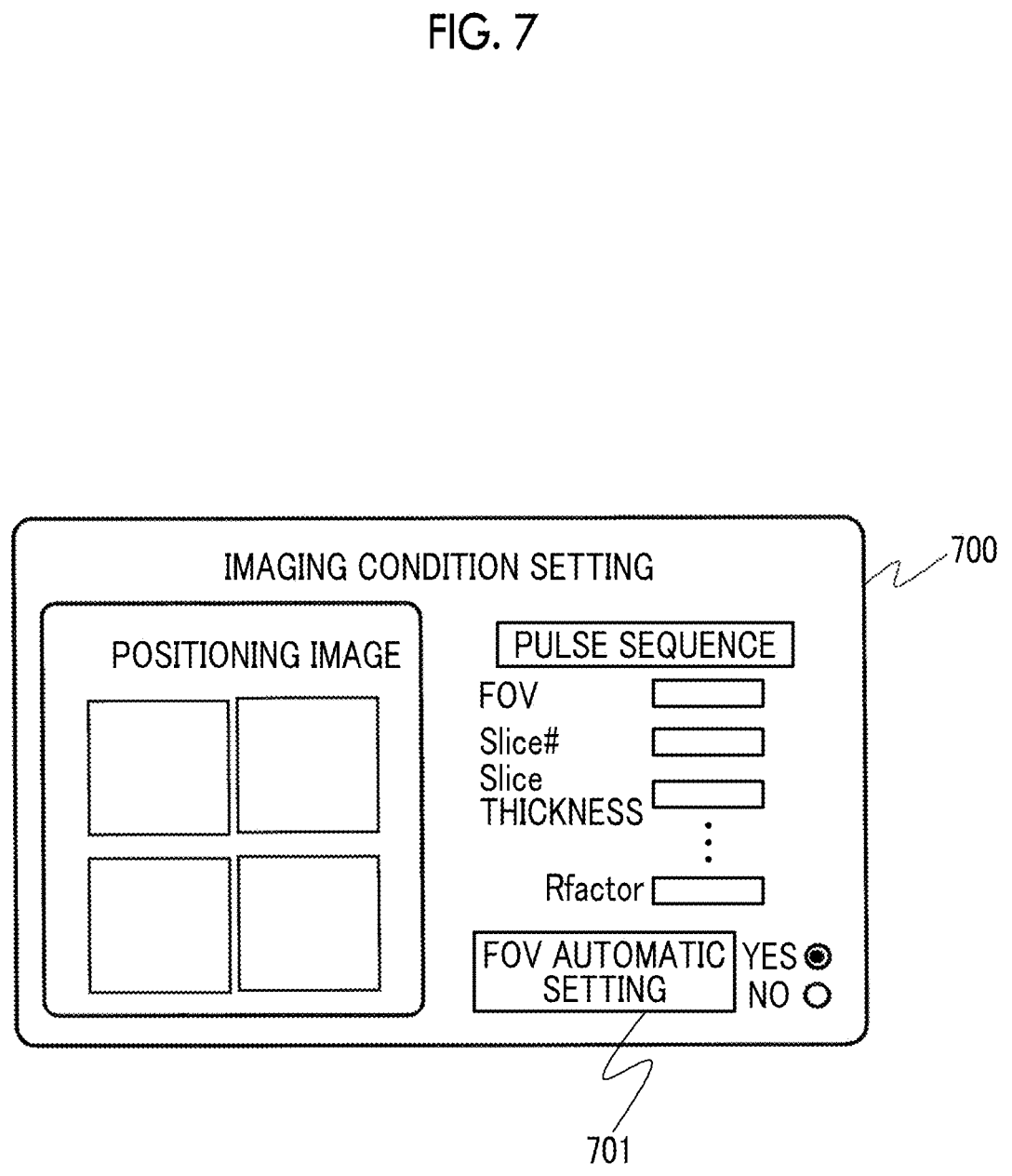

IMAGING CONDITION SETTING ~700

POSITIONING IMAGE

PULSE SEQUENCE

FOV

Slice#

Slice
THICKNESS

⋮

Rfactor

FOV AUTOMATIC
SETTING       YES ◉
              NO ○

701

MAGNETIC RESONANCE IMAGING APPARATUS AND METHOD OF SUPPORTING SETTING OF IMAGING CONDITION THEREOF

CROSS-REFERENCE TO RELATED APPLICATION

The present application claims priority from Japanese patent application JP-2023-074679 filed on Apr. 28, 2023, the content of which is hereby incorporated by reference into this application.

BACKGROUND OF THE INVENTION

1. Field of the Invention

The present invention relates to a magnetic resonance imaging (MRI) apparatus, and particularly relates to a technique of supporting user settings of imaging conditions in the MRI apparatus.

2. Description of the Related Art

In MRI examination, an examination part is disposed in a uniform static magnetic field region, and a reception coil having a plurality of channels is installed at an examination part. In order to perform imaging, an examiner needs to set various imaging conditions. A setting of a FOV that is an imaging range is also one of the imaging conditions.

In MRI imaging, Fourier imaging of adding spatial information to a magnetic resonance signal using frequency encoding and phase encoding is mainstream. In the Fourier imaging, in a case where a subject is present outside a set FOV, aliasing occurs in principle in a phase encoding direction of an image.

As a method of preventing this aliasing, the following methods have been known in the related art. In one method, the FOV is expanded, in which an operator checks the aliasing occurring in an image captured in the FOV set at the beginning and re-sets the FOV in the phase encoding direction to be expanded so that the aliasing does not occur, and captures an image. In another method, a sensitivity distribution of the reception coil is adjusted, so that a channel of the reception coil is selected (re-set) to capture an image so that a signal in a region where the aliasing occurs is not received. In any of the methods, the operator needs to perform this troublesome operation, which reduces an examination efficiency. On the other hand, in a case where this operation is not appropriately performed, there is a problem in that aliasing occurs and cannot be diagnosed.

In addition to the aliasing in the phase encoding direction, JP4945585B proposes a method of dealing with an artifact caused by aliasing in a slice direction generated in a case where a slice selection gradient magnetic field pulse is emitted. In this method, in a case where a slice is selected and excited, in order to control a signal that is mixed from outside the slice due to incompleteness of the slice selection, a control of controlling a polarity (positive or negative) of a gradient of a gradient magnetic field or a control of shifting a sensitivity distribution of the reception coil is performed in accordance with a position from the magnetic field center.

SUMMARY OF THE INVENTION

The method disclosed in JP4945585B is intended to reduce the artifact in the slice direction generated in a case where the slice selection gradient magnetic field pulse is emitted, and thus cannot be directly applied to the aliasing in the phase encoding direction in an image plane.

An object of the present invention is to provide a technique of supporting an operator by performing, on an apparatus side, troublesome re-setting of a FOV that was executed by the operator in the related art, particularly, setting of the FOV for avoiding aliasing in a phase encoding direction or resetting of a reception channel.

An MRI apparatus according to an aspect of the present invention comprises a unit that determines, based on a condition (setting of a FOV or weighting of a reception channel) set at the beginning, occurrence of aliasing in a case where imaging is performed under the condition, and resets a condition under which the aliasing does not occur by considering imaging conditions or characteristics of the apparatus other than the FOV and the weighting of the reception channel, based on a determination result.

Specifically, the MRI apparatus according to the aspect of the present invention comprises: an imaging unit including a magnet that generates a uniform static magnetic field, a transmission coil that applies a high-frequency magnetic field to a subject placed in the static magnetic field, a reception coil that has a plurality of elements and receives a nuclear magnetic resonance signal generated from the subject, and a gradient magnetic field coil for adding spatial information to the nuclear magnetic resonance signal; and a computer including a reconstruction unit that reconstructs an image by using the nuclear magnetic resonance signal, and an imaging condition setting unit that sets an imaging condition including at least a FOV as a condition for imaging performed by the imaging unit.

The computer further includes an aliasing signal range estimation unit that estimates a spatial range in which an aliasing signal from a phase encoding direction occurs, based on the FOV set as the imaging condition, a determination unit that determines whether or not it is necessary to perform a change of the imaging condition, which includes at least one of a change of the FOV or a change of a weight of each channel constituting the reception coil, based on an estimation result of the aliasing signal range estimation unit, a FOV change unit that decides a range of the FOV to be changed, based on a determination result of the determination unit and the estimation result of the aliasing signal range estimation unit, and a channel weighting amount calculation unit that calculates a weighting amount of each channel constituting the reception coil, based on the determination result of the determination unit and the estimation result of the aliasing signal range estimation unit. In a case where the imaging condition is changed, the imaging condition setting unit changes a set imaging condition to a new imaging condition.

In addition, a method of supporting setting of an imaging condition of a magnetic resonance imaging apparatus comprises: estimating a range in which an aliasing signal occurs, based on a FOV set at the beginning, by using a positioning image; determining whether it is necessary to perform a change of an imaging condition based on an estimation result; and performing at least one of a change of the FOV or a change of a weight of each channel of a reception coil of the magnetic resonance imaging apparatus in a case where it is determined that the change of the imaging condition is necessary.

By configuring the MRI apparatus to have a function of determining the occurrence of the aliasing and a function of setting the imaging condition under which the aliasing does not occur by using the determination result, it is possible to avoid complexity of the re-setting by a user. As a result, it is possible to improve the examination efficiency.

BRIEF DESCRIPTION OF THE DRAWINGS

FIG. 2 is a functional block diagram of a computer of the MRI apparatus.

FIG. 7 is a diagram showing an example of a UI screen of changing a FOV and changing a Ch weight according to a modification example.

DESCRIPTION OF THE PREFERRED EMBODIMENTS

Hereinafter, embodiments of the present invention will be described.

First, an overall configuration of an MRI apparatus will be described with reference to FIG. 1.

Figure 1:
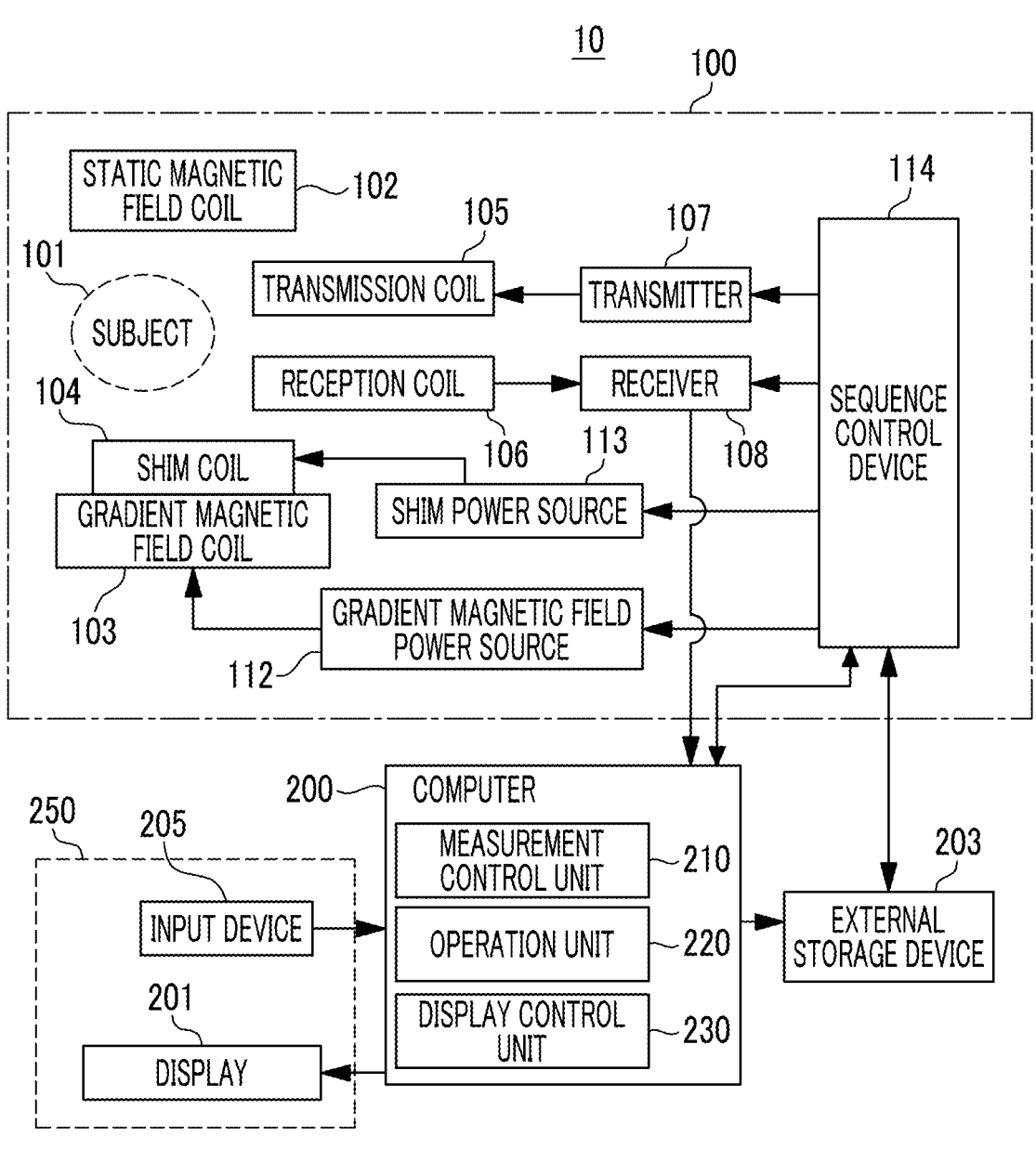
FIG. 1 is a block diagram showing an overall configuration of an MRI apparatus.

As shown in FIG. 1, an MRI apparatus 10 is mainly composed of an imaging unit 100 that collects a nuclear magnetic resonance signal generated from a subject and a computer 200 that performs control of the imaging unit 100 and operation such as image reconstruction using the nuclear magnetic resonance signal collected by the imaging unit 100, and comprises a display 201, an input device 205, and an external storage device 203 as accessory devices of the computer 200. The display 201 and the input device 205 may be disposed close to each other and function as a UI unit 250 for interacting with a user.

The computer 200 is configured of a general-purpose computer or a workstation comprising a CPU or a GPU, and a memory, and comprises a measurement control unit 210 that controls an operation of the imaging unit 100, an operation unit 220 that operates a signal or an image collected by the imaging unit 100, and a display control unit 230 that controls display of the UI unit 250 (display). A part of the functions of the computer 200 may be realized by hardware such as a programmable IC, or may be realized by a processing apparatus different from the MRI apparatus, and the computer 200 is assumed to be used in the broadest concept including these cases.

The configuration and the functions of the imaging unit 100 are the same as those of a general MRI apparatus. In a simple description, the imaging unit 100 comprises a static magnetic field coil 102 that generates a static magnetic field, a gradient magnetic field coil 103 that generates a gradient magnetic field in three axial directions orthogonal to each other, an RF transmission coil (hereinafter, referred to as a transmission coil) 105 that emits a high-frequency magnetic field, an RF reception coil (hereinafter, referred to as a reception coil) 106 that detects a nuclear magnetic resonance signal generated from a subject 101, a transmitter 107 that supplies a predetermined high-frequency current to the transmission coil 105, a receiver 108 to which the reception coil 106 is connected, a gradient magnetic field power source 112 that drives the gradient magnetic field coil 103, and a sequence control device 114.

The reception coil 106 is usually a multi-channel coil in which a plurality of small coils with different sensitivity distributions are combined, and a weight of each small coil is adjusted by a control described below, whereby the sensitivity distribution can be adjusted.

The sequence control device 114 drives the transmitter 107, the receiver 108, and the gradient magnetic field power source 112 in accordance with a preset pulse sequence. In this case, the measurement control unit 210 sets parameters of the pulse sequence and imaging conditions to control the sequence control device 114. There are various parameters and imaging conditions for imaging, such as a TE, a TR, a FOV, a slice thickness, the number of addition times, and a speed rate, including those set as default by the pulse sequence and those that can be set or adjusted by the user via the UI unit 250. In the MRI apparatus according to the present embodiment, a function of supporting user settings, particularly in setting of the FOV and weighting of each channel (small coil) constituting the reception coil, among the imaging conditions is added.

Therefore, as shown in FIG. 2, the operation unit 220 of the computer 200 according to the present embodiment comprises an aliasing signal range estimation unit 221 that estimates a range of an aliasing signal, a channel weighting amount calculation unit (Ch weighting amount calculation unit) 223, a FOV change unit 225, a determination unit 227, and a reconstruction unit 229. The aliasing signal range estimation unit 221 estimates a range in which the aliasing signal occurs based on the set imaging condition. In the estimation of the aliasing signal range, deformation of a static magnetic field distribution and confirmation of a uniform static magnetic field range are performed depending on the aspect. Details of the process will be described below.

The Ch weighting amount calculation unit 223 calculates a weight used for subsequent image reconstruction operation for a plurality of small coils (coils of the respective channels) constituting the reception coil 106, based on an estimation result of the aliasing signal range. The FOV change unit 225 changes the range of the FOV such that the aliasing signal does not occur in the FOV, based on the estimation result of the aliasing signal range. At least one of the calculation of the weight or the change of the FOV is performed.

The determination unit 227 determines whether or not it is necessary to change the imaging condition for removal of the aliasing based on the estimation result of the aliasing signal range estimation unit 221, and determines whether it is necessary to change one or both of the FOV and the Ch weight as the change of the imaging condition.

The reconstruction unit 229 performs an operation such as Fourier transformation by using a reception signal (NMR signal) received by the reception coil 106 to reconstruct an image. In this case, signals from the plurality of small coils (referred to as channels) are combined using the sensitivity distribution of each channel and the weighting amount calculated by the Ch weighting amount calculation unit 223, and one image is reconstructed. As a method of the combination, a known method, such as weighted-averaging using a weight, combination called multi array coil (MAC) combination using each weight and a sensitivity distribution, or parallel imaging (PI) combination that expands a signal of a FOV reduced according to a speed rate and reconstructs an image of an original FOV, is used.

Next, an operation of the MRI apparatus according to the embodiment, mainly a process of re-setting the imaging condition, will be described based on the above configuration. In the following embodiments, the configurations of the apparatuses shown in FIGS. 1 and 2 are common, and the drawings are referred to as necessary.

Embodiment 1

In the present embodiment, the aliasing signal range is estimated by using a positioning image, and the FOV change or the weight change of the channel is performed. In addition, in the FOV change, the FOV in the phase encoding direction is set to be large such that the aliasing signal in the FOV is reduced based on the aliasing signal range estimated by the aliasing signal range estimation unit.

Hereinafter, the processing of the present embodiment will be described with reference to a flow of the process in FIG. 3.

The subject 101 is transported to a static magnetic field space in which the static magnetic field coil 102 is generated, and a positioning image for positioning an examination part at a center of the static magnetic field space is captured (S1). The positioning image is acquired as, for example, images of three cross sections of an AX plane, a COR plane, and a SAG plane, and a subject position where the examination part is located at the center of the static magnetic field space is decided from the images of the three cross sections. In this case, the phase encoding direction and the frequency encoding direction are determined according to the imaging cross section (slice plane).

Next, the imaging conditions are set (S2 and S3). As described above, various imaging conditions are included, and there are conditions to be automatically set on the apparatus side and conditions to be set by the operator. FIG. 3 shows the FOV and the weight of the reception coil, which are important conditions for the occurrence of the aliasing signal. In step S2, the operator sets a size or position of the FOV and the phase encoding direction according to the imaging part, the cross section, and the contrast by using the positioning image (S2). The FOV may be automatically set by the apparatus side by determining a subject portion included in the positioning image.

A weight of each channel of the reception coil 106 is initially set to 1 (S3). Note that in a case where the reception coil 106 is, for example, a wide-area reception coil covering a wide region of the subject such as the entire abdomen, only the channel in a predetermined range including the examination part may be set to 1, and the channel distant from the examination part may be set to 0 in advance.

The aliasing signal range estimation unit 221 sets a region having a high signal value as the aliasing signal range based on signal values in the FOV set in the positioning image and on both sides thereof (S4). The determination of the aliasing signal range can be made by, for example, sequentially determining, for each region having a predetermined width in the phase encoding direction with respect to the signal value (average value of the pixels) in the FOV, whether or not the average value of the pixels in the region is equal to or greater than a predetermined ratio (for example, 50%), and determining a region including the entire width equal to or greater than the predetermined ratio as the aliasing signal range. Note that the determination method is not limited to this example.

Figure 4:
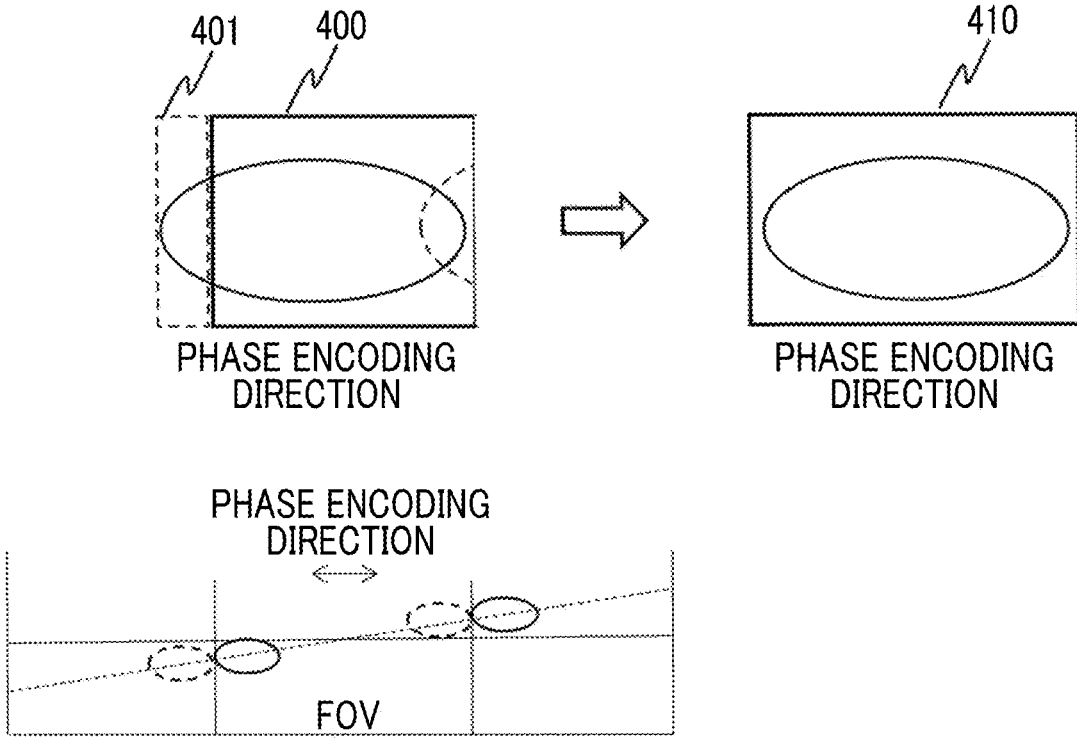
FIG. 4 is a diagram describing a determination result of a determination unit.

FIG. 4 is an example showing the determination result. In this example, since there is no subject on a right side of a FOV 400, the signal value is close to zero, and since there is a subject on a left side, the signal value is high in a region 401 adjacent to the left side of the FOV 400. As shown on a lower side of FIG. 4, a certain subject in this region is encoded with the same phase encoding gradient magnetic field as the subject in the FOV, and is folded back to the image of the subject. Therefore, the aliasing signal range estimation unit 221 estimates the region 401 on the left side, in which the signal value is higher than a predetermined value, as the aliasing signal range.

In a case where the aliasing signal range estimation unit 221 estimates that there is no aliasing on both sides of the FOV as a result of the estimation (S5), the result is transmitted to the measurement control unit 210, and the measurement control unit 210 starts imaging (main scan) using the FOV and the Ch weight set at the beginning (S7). After the imaging, the reconstruction unit 229 performs channel composition using the set Ch weight in S2 to reconstruct an image (S8).

On the other hand, as the result of the estimation of the aliasing signal range estimation unit 221, in a case where the aliasing signal range is estimated and confirmed on both sides or any one side of the FOV (S5), the result thereof is transmitted to the determination unit 227 as the position and the size (the width of the range) of the aliasing signal range with respect to the FOV. The determination unit 227 determines whether to change the FOV or to change the Ch weight of the reception coil based on the estimation result related to the aliasing signal range, and the Ch weighting amount calculation unit 223 and the FOV change unit 225 perform the processing accordingly (S6).

The determination regarding whether to change the FOV or to change the Ch weight is performed, for example, in consideration of other imaging conditions or apparatus characteristics. For example, the FOV in the phase encoding direction depends on the phase encoding point number (Np), the maximum application intensity Gp of the gradient magnetic field in the phase encoding direction, and the application time ($\tau$) of the gradient magnetic field in the phase encoding direction (FOV=Np/2$\gamma$Gp$\tau$). Gp and $\tau$ are determined by the characteristics of the apparatus, and the FOV is its limitations. In addition, in a case where the FOV is expanded while maintaining the spatial resolution, Np is increased. As a result, the imaging time may be limited because the imaging time is extended. In a case where the FOV cannot be changed due to such a limitation, the Ch weight is changed. In addition, the reception coil is mounted on the subject such that the center thereof is located substantially at the center of the examination part, but the examination part and the center of the reception coil may be shifted from each other or it may be difficult to understand the relationship between the examination part and each channel depending on the examination part. In such a case, the FOV is changed to deal with the case. In addition, if possible, both the change of the FOV and the change of the Ch weight may be performed, and in this case, it is possible to more effectively remove the aliasing signal, that is, to suppress the aliasing.

Figure 5:
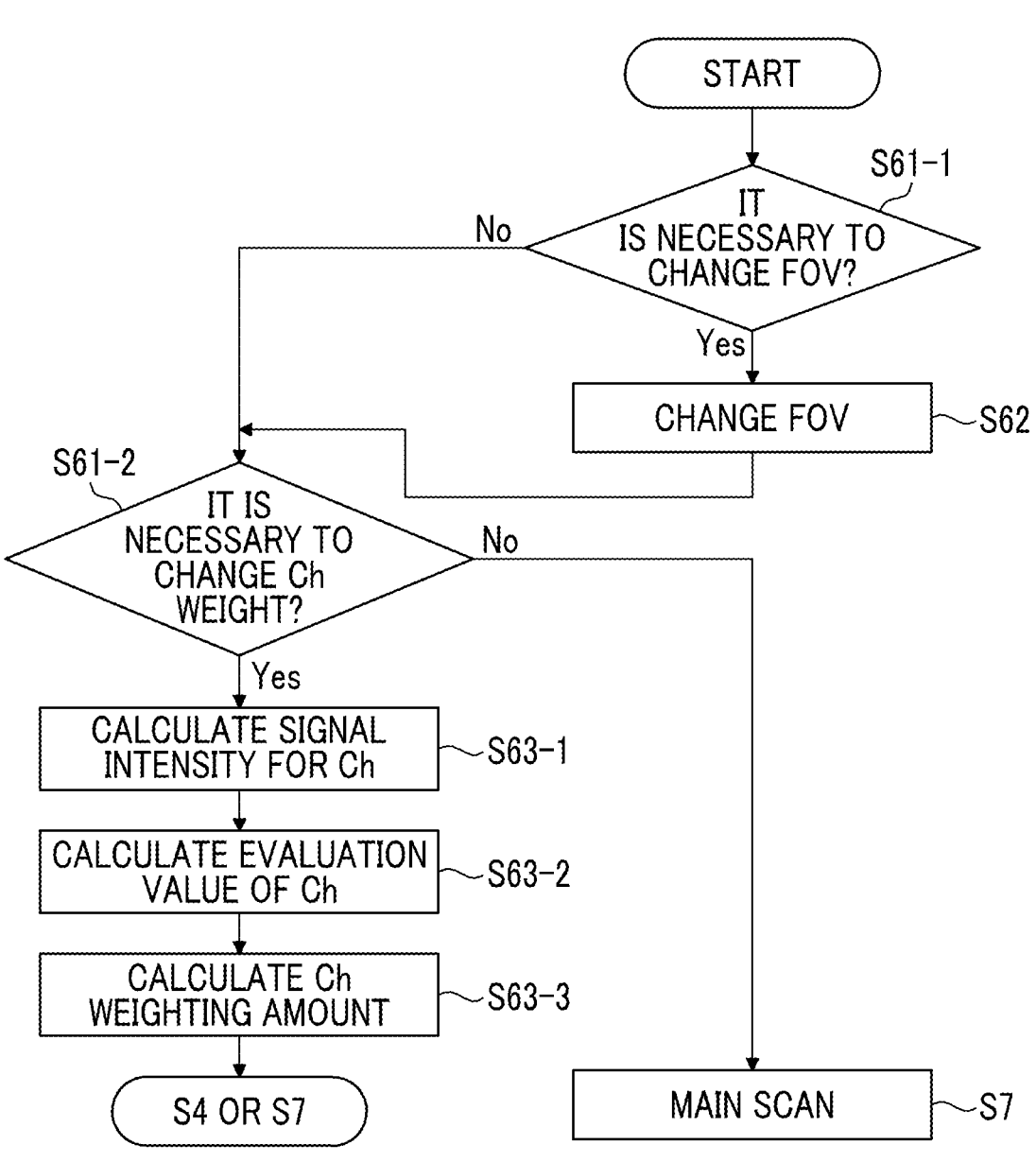
FIG. 5 is a flowchart showing details of a process of changing a FOV and changing a Ch weight.

Details of the process of S6 are shown in FIG. 5.

As the determination result by the determination unit 227 (S61-1), in a case where it is necessary to perform the change of the FOV, the FOV change unit 225 changes the FOV from the Ch weight set in S3 and the aliasing signal range estimated in S4 (S62). Specifically, in a case where the size of the set FOV in the phase encoding direction is denoted by FOV1 and the size of the aliasing signal range in the phase encoding direction is denoted by FOV2, the FOV represented by Expression (1) is calculated as FOVnew without aliasing.

$$FOVnew = FOV1 + FOV2 \qquad (1)$$

In the example in FIG. 4, the FOV 400 is expanded to a FOV 410.

In addition, as the determination result by the determination unit 227 (S61-2), in a case where it is necessary to perform the change of the Ch weight, the Ch weighting amount calculation unit 223 calculates the weighting amount of each channel from the signal amount in the aliasing signal range of each channel of the reception coil and the signal amount in the FOV. Specifically, the Ch weighting amount calculation unit 223 calculates a signal intensity f(ch) in the FOV of each ch and a signal intensity g(ch) in the aliasing signal range by using the positioning image (S63-1).

Then, for example, an evaluation value E(ch) of each channel is calculated from the signal intensities by using, for example, Expression (2) (S63-2).

$$E(ch) = f(ch)/g(ch) \qquad (2)$$

In Expression (2), f(ch) represents a sum of squares of absolute values of signal intensities of ch's in the FOV, and g(ch) represents a total sum of absolute values of signal intensities of ch's in the aliasing signal range. The evaluation value E(ch) is not limited to Expression (2). f(ch) and g(ch) may be any real number power (for example, 0 or 0.5) instead of the square of the absolute value. For example, in a case where f(ch) is raised to the power of 0, f(ch) of the signal intensities in the FOV does not change for each ch (f(ch)=1), and the evaluation value reflects only the signal intensity of the aliasing signal range.

The weighting amount is calculated based on this evaluation value (S63-3). The weighting amount (weight W(ch)) is obtained, for example, as W(ch)=E(ch)/Σ(E(ch)). Alternatively, the evaluation values E(ch) are arranged in descending order (in order of magnitude), and the weight of ch in which the cumulative sum exceeds a certain threshold value is set to 1, and all others are set to 0. Further, one threshold value or a plurality of threshold values (for example, Th1 and Th2) may be set for the evaluation value, and the weight may be partially linearly transformed, such as by giving a weight of 1 to the evaluation value of Th1 or more, a weight of 0 to the evaluation value of Th2 or less, and a weight of 0.5 to the evaluation value of the channel of Th1 to Th2, and the weight may be changed from 1 to 0 using the evaluation value as a variable from the maximum to the minimum of the evaluation value.

In a case where the FOV is changed, the position of the FOV is changed, and the estimation of the aliasing signal range is performed again (S4). In addition, in a case where the Ch weight is changed, the positioning image may be reconstructed using a different Ch weight, and the aliasing signal range may be estimated using the reconstructed image (S4). Instead of using the positioning image, an image may be acquired using the changed FOV or the reconstruction may be performed using the changed Ch weight, and the aliasing signal range may be estimated using the image. The imaging in this case may be performed under the same conditions as the main scan or the scan for the positioning image, or may be performed under different conditions.

In a case where it is determined that there is no aliasing as a result of the estimation of the aliasing signal range (S5), the process proceeds to the imaging of the main scan (S7) in the same manner as in the first time. In FIG. 3, a flow in which S6 and S4 are repeated is made until it is determined in S5 that there is no aliasing, but the number of repetitions may be limited. For example, as indicated by an arrow of a dotted line in FIG. 3, the main scan may be performed only by one change, or after the change (S6), the number of changes may be determined, and in a case where the number of changes reaches a predetermined number, the main scan may be performed.

The imaging conditions set at the beginning and the FOV finally decided are transmitted to the sequence control device 114 via the measurement control unit 210, and a final imaging sequence is decided here, and the imaging of the main scan is performed (S7).

The reconstruction unit 229 performs weighted reconstruction on the images by using the nuclear magnetic resonance signal received by each channel and the final Ch weighting amount by executing the main scan (S8). Specifically, in the weighted reconstruction, in a case where the Ch weight decided in step S3 or step S6 is denoted by W(ch) and the signal intensity of each channel is denoted by S(ch), the weighted reconstructed image I is represented by Expression (3).

$$I = \Sigma W(ch)S(ch) \qquad (3)$$

The weighted reconstruction may be performed by using a sensitivity map of each small coil. In this case, in a case where the Ch weight decided in step S3 or step S6 is denoted by W(ch), the sensitivity of each channel is denoted by C(ch), and the signal intensity of each channel is denoted by S(ch), the weighted reconstructed image I is represented by Expression (4).

$$I = \Sigma A(ch)S(ch) \qquad (4)$$

Here, $A(ch)=(C'^{H}(ch)C'(ch))^{-1}C'^{H}(ch)$(H represents a complex transposition)

$$C'(ch) = W(ch)C(ch)/\{\Sigma W(ch)C(ch)\}$$

The image reconstruction using the sensitivity map can be applied to parallel imaging having a speed rate of 2 or more in addition to the MAC composition having a speed rate of 1.

Figure 6:
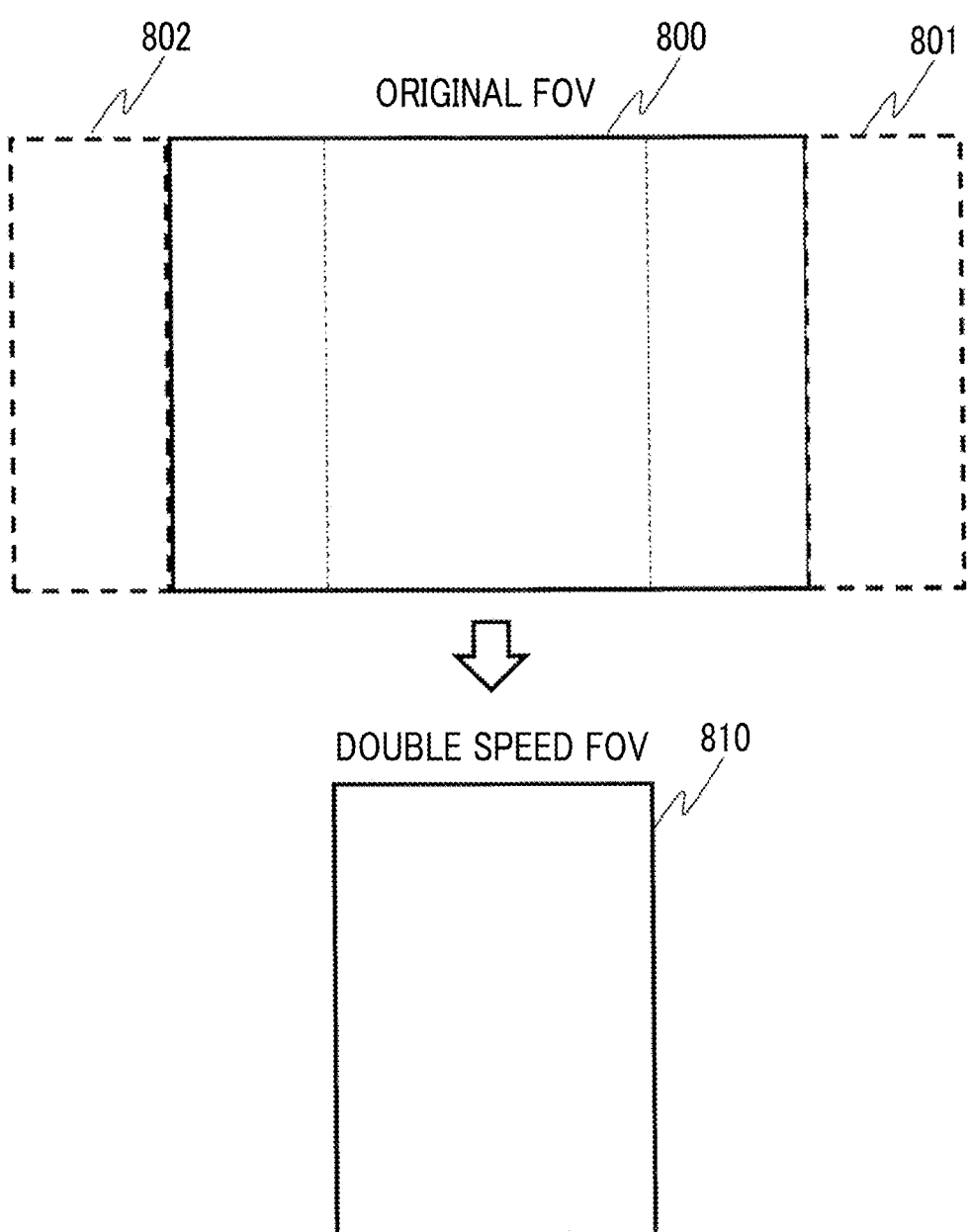
FIG. 6 is a diagram describing application to parallel imaging.

In the parallel imaging, as shown in FIG. 6, the phase encoding is thinned out with respect to the original FOV 800 in accordance with the speed rate to perform signal collection. Therefore, the FOV 810 is reduced, and the obtained image originally includes aliasing. In the parallel imaging, an image with developed aliasing is obtained by estimating thinned-out data using the sensitivity distribution of the reception coil.

Even in this parallel imaging, in a case where there is a range in which the aliasing signal is generated outside the original FOV 800, the aliasing from the outside is included in addition to the original aliasing. Since the aliasing signal ranges 801 and 802 can be estimated from the outside of the FOV by using the positioning image and the magnetic field map (static magnetic field distribution deformed by the gradient magnetic field) as in Embodiment 1, the aliasing caused by the signal mixed from the outside can be removed by changing the original FOV using this estimation result.

As described above, according to the present embodiment, since the occurrence of the aliasing signal and the range thereof are estimated on the apparatus side, and the imaging condition to be changed is changed based on the estimation result, it is possible to eliminate the need for the user to re-set the imaging condition, and it is possible to improve the MR examination efficiency.

Modification Example 1

In Embodiment 1, a case where the determination unit 227 automatically determines whether to change the FOV or to change the Ch weight in a case where it is estimated that there is aliasing as the result of the estimation of the aliasing signal range is shown, but the selection by the user may be accepted via the UI unit 250. FIG. 7 shows a display screen example of the UI unit 250 that accepts the user selection. FIG. 7 is an example of an imaging condition setting screen 700, and in a case of setting the imaging condition, a button 701 for selecting automatic setting of the FOV or the like is displayed. The FOV to be set at the beginning is input from a condition setting unit 702.

Figure 3:
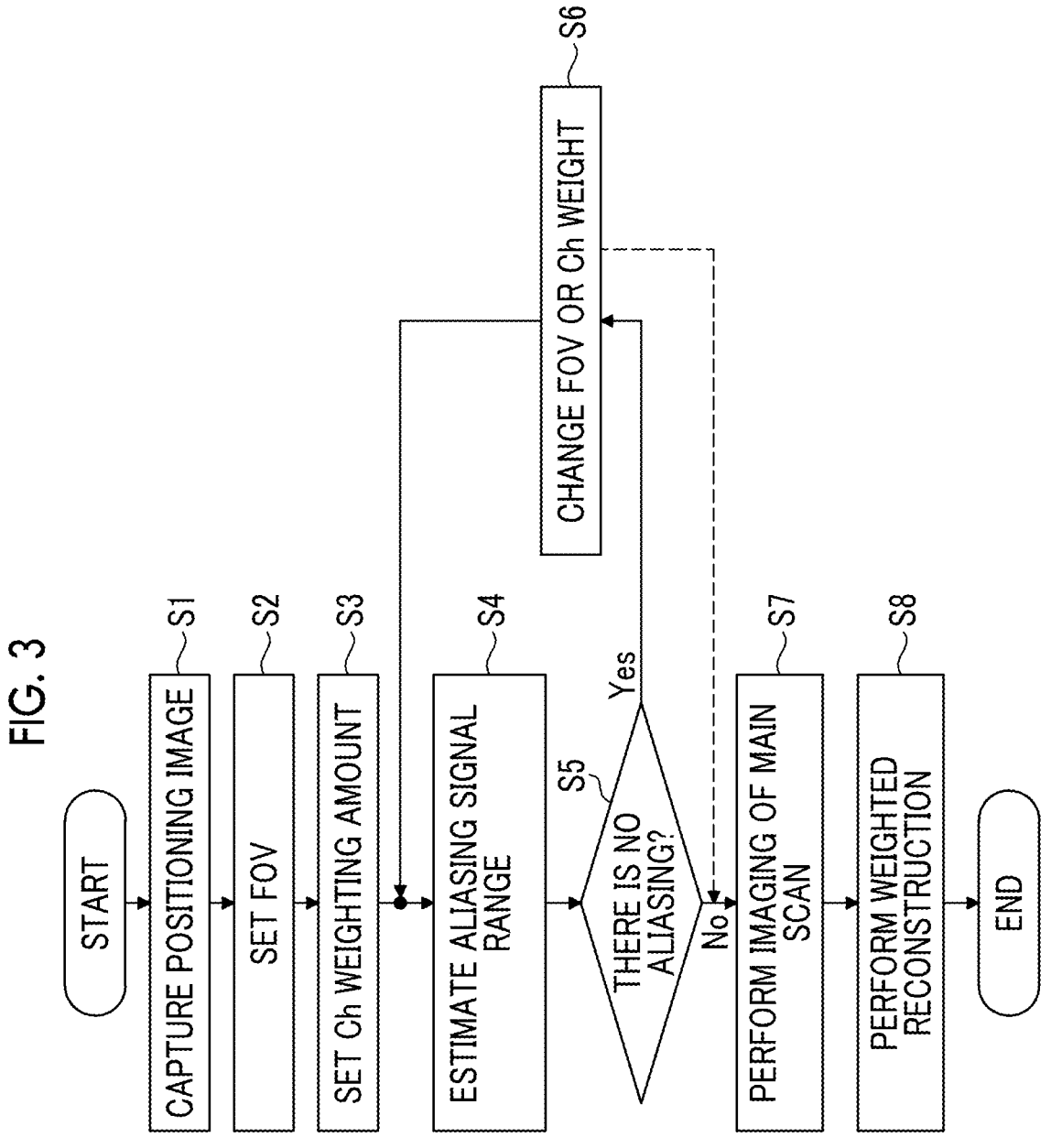
FIG. 3 is a flowchart showing a process of re-setting an imaging condition of Embodiment 1.

In a case where the button 701 is operated, the process of S4 and the subsequent processes in FIG. 3 are started, and in a case where the process proceeds to step S6, a UI (for example, a pull-down type display or a text type display) for selecting the FOV change and the Ch weight change is displayed. A user selects either one or both in consideration of the imaging time, the configuration of the reception coil, and the like.

By giving a degree of freedom to the user in this way, the effectiveness of the user support can be improved.

FIG. 7 is an example of the user selection, and the time of selecting the automatic setting, the method of selecting the automatic setting, and the like can be appropriately changed, and the UI can be displayed accordingly.

Embodiment 2

In Embodiment 1, a case where the aliasing signal range is estimated from the positioning image to expand the FOV has been described. However, in the present embodiment, in a case where the FOV is expanded, the aliasing signal range is confirmed by excluding a range in which the signal is not desired to be collected in consideration of the static magnetic field non-uniformity. Therefore, in the present embodiment, the aliasing signal range is confirmed by using the positioning image and the magnetic field map.

The flow of the process in the present embodiment is the same as that in FIG. 3, and the process of the present embodiment will be described below with reference to FIG. 3, focusing on points different from Embodiment 1.

Also in the present embodiment, the first imaging condition is set through the user setting or the apparatus automatic setting after the positioning image is acquired (S1 to S3).

After the completion of the setting, the aliasing signal range estimation unit 221 decides the aliasing signal range in the phase encoding direction based on the positioning image, the set FOV, and the magnetic field map (S4).

Figure 8:
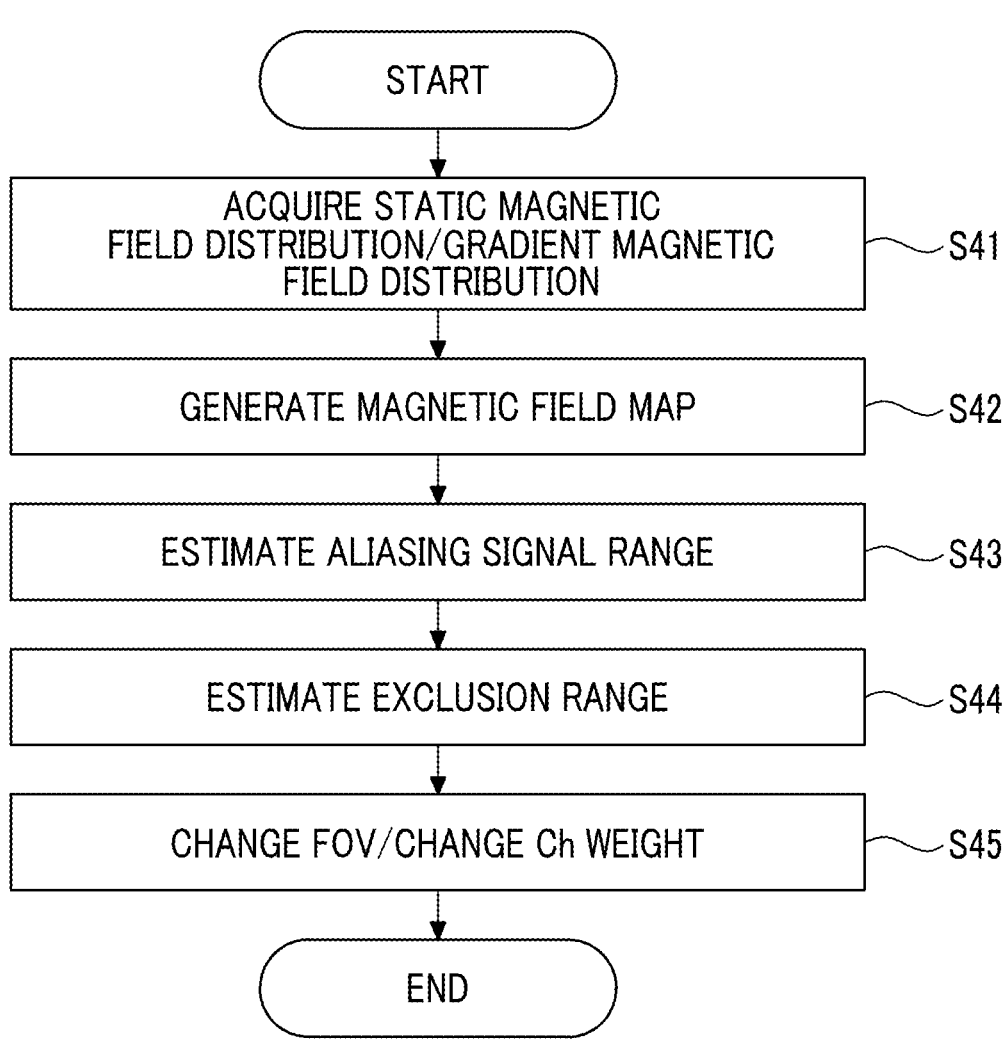
FIG. 8 is a flowchart showing a part of imaging condition setting processing according to Embodiment 2.

Details of this process are shown in FIG. 8. First, the aliasing signal range estimation unit 221 generates a magnetic field map in which the static magnetic field distribution is spatially deformed using the gradient magnetic field distribution (gradient magnetic field in the phase encoding direction) (S41, S42). The static magnetic field distribution can be measured in advance as a characteristic of the apparatus, and the gradient magnetic field distribution can be acquired by simulation. Information on the distribution is stored, for example, in the internal storage device or the external storage device 203 as apparatus characteristic data and is read and used in the aliasing signal range estimation process.

Figure 9:
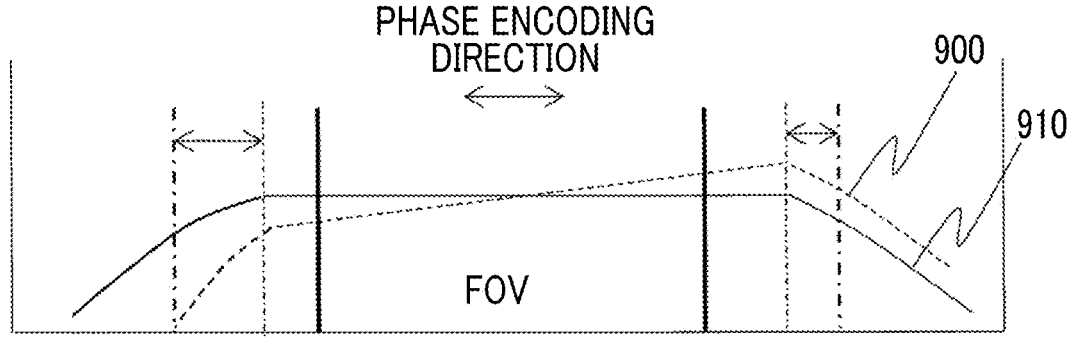
FIG. 9 is a diagram describing a magnetic field map of a static magnetic field deformed by a gradient magnetic field.

FIG. 9 shows an example of the magnetic field map. As shown in FIG. 9, a gradient magnetic field distribution 900 loses its linearity at a position away from the magnetic field center due to the incompleteness of the gradient magnetic field coil. Therefore, the static magnetic field distribution deformed by the gradient magnetic field distribution, that is, a magnetic field map 910 is deformed to reflect a portion where the linearity of the gradient magnetic field distribution is not maintained.

Figure 10:
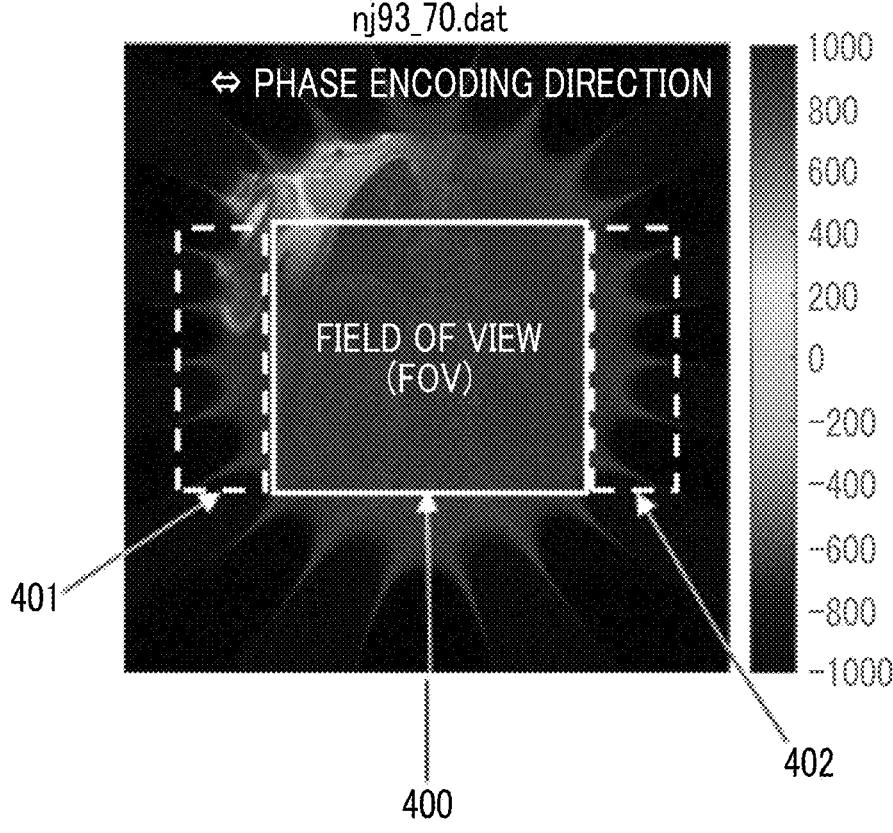
FIG. 10 is a diagram showing an image example in which the magnetic field map is superimposed on a positioning image.

The aliasing signal range estimation unit 221 compares the set FOV with the outside region of the FOV in the image in which the magnetic field map (the static magnetic field distribution deformed by the gradient magnetic field distribution) and the positioning image (the image of the cross section of the imaging part) are superimposed on each other, and estimates the aliasing signal range and removes a portion where the linearity of the magnetic field map is not maintained, that is, a region in which the static magnetic field is non-uniform (S43, S44). FIG. 10 shows the magnetic field map superimposed on the positioning image. In FIG. 10, a left-right direction is the phase encoding direction, and a portion 400 surrounded by a white square is a region set as the FOV. As shown in a color bar (white and black bar) in FIG. 10, the uniformity of the magnetic field map is reduced in the regions 401 and 402 on both sides of the FOV 400.

The aliasing signal range is estimated by using the signal value in the FOV and the signal values on both sides of the FOV in the same manner as in Embodiment 1. In order to remove the region in which the static magnetic field is non-uniform, the FOV and the static magnetic field distributions on both sides of the FOV are compared on the magnetic field map, and a portion where the uniformity is reduced is excluded from the aliasing signal range.

The process after the estimation of the aliasing signal range is the same as that in Embodiment 1, in which it is determined whether to apply any or both of the change of the FOV and the change of the Ch weight, and the determined process is performed (S45). In the present embodiment, for example, the change of the FOV and the change of the Ch weight may be used in combination, for example, the FOV may be changed to expand to a region estimated as the aliasing signal range, and for a region to be excluded, the weight of the channel having the maximum sensitivity distribution in that region may be set to a small value (or 0). In addition, as described in the modification example of Embodiment 1, the user's selection may be accepted as to which one to prioritize.

In addition, in the calculation of the Ch weighting amount, in Embodiment 1, the evaluation value is calculated based on the FOV and the signal intensities on both sides thereof (Expression (2)), but the evaluation value can also be calculated based on the degree of the uniformity of the magnetic field distribution shown in FIG. 9.

According to the present embodiment, the same effects as those of Embodiment 1 can be obtained, and further, the estimation of the aliasing signal range can be performed by using the magnetic field distribution which is the characteristic of the apparatus, so that it is possible to set the appropriate FOV or to set the weight of the channel without capturing the signal from the magnetic field non-uniformity.

EXPLANATION OF REFERENCES

10: MRI apparatus
100: imaging unit
200: computer
210: measurement control unit
220: operation unit
221: aliasing signal range estimation unit
223: channel weighting amount calculation unit
225: FOV change unit
227: determination unit
229: reconstruction unit
230: display control unit
250: UI unit

What is claimed is:
1. A magnetic resonance imaging apparatus comprising:
an imaging unit including a magnet that generates a uniform static magnetic field, a transmission coil that applies a high-frequency magnetic field to a subject placed in the static magnetic field, a reception coil that has a plurality of elements and receives a nuclear magnetic resonance signal generated from the subject, and a gradient magnetic field coil for adding spatial information to the nuclear magnetic resonance signal; and
a computer including a reconstruction unit that reconstructs an image by using the nuclear magnetic resonance signal, and an imaging condition setting unit that sets an imaging condition including at least a FOV as a condition for imaging performed by the imaging unit, wherein the computer further includes
an aliasing signal range estimation unit that estimates a spatial range in which an aliasing signal from a phase encoding direction occurs, based on the FOV set as the imaging condition,
a determination unit that determines whether or not it is necessary to perform a change of the imaging condition, which includes at least one of a change of the FOV or a change of a weight of each channel constituting the reception coil, based on an estimation result of the aliasing signal range estimation unit,
a FOV change unit that decides a range of the FOV to be changed, based on a determination result of the determination unit and the estimation result of the aliasing signal range estimation unit, and
a channel weighting amount calculation unit that calculates a weighting amount of each channel constituting the reception coil, based on the determination result of the determination unit and the estimation result of the aliasing signal range estimation unit, and
in a case where the imaging condition is changed, the imaging condition setting unit changes a set imaging condition to the changed imaging condition.
2. The magnetic resonance imaging apparatus according to claim 1, wherein the aliasing signal range estimation unit estimates an aliasing signal range by using a positioning image acquired by the imaging unit.
3. The magnetic resonance imaging apparatus according to claim 2,
wherein the aliasing signal range estimation unit estimates the aliasing signal range based on a signal intensity of regions on both sides of the FOV in at least one of a set phase encoding direction or a set slice encoding direction in the positioning image.
4. The magnetic resonance imaging apparatus according to claim 1,
wherein the aliasing signal range estimation unit estimates an aliasing signal range by using a positioning image acquired by the imaging unit and a magnetic field map.
5. The magnetic resonance imaging apparatus according to claim 4,
wherein the aliasing signal range estimation unit decides the aliasing signal range excluding a region where a magnetic field is non-uniform in the magnetic field map.
6. The magnetic resonance imaging apparatus according to claim 4,
wherein the magnetic field map is a magnetic field map acquired in advance as a characteristic of the static magnetic field generated by the magnet.
7. The magnetic resonance imaging apparatus according to claim 4,
wherein the magnetic field map is a static magnetic field map obtained by deforming a static magnetic field map acquired in advance as a characteristic of the static magnetic field generated by the magnet, based on a gradient magnetic field characteristic acquired in advance.
8. The magnetic resonance imaging apparatus according to claim 1, further comprising:
a UI unit that receives user's selection,
wherein the determination unit presents a UI for the user to select a priority of the change of the FOV and the change of the weight of each channel to the UI unit, and performs the determination based on user's selection via the UI.
9. The magnetic resonance imaging apparatus according to claim 1,
wherein, in a case where the imaging condition set by the imaging condition setting unit is changed, the aliasing signal range estimation unit again estimates the spatial range in which the aliasing signal from the phase encoding direction occurs, based on a new imaging condition.
10. The magnetic resonance imaging apparatus according to claim 9,
wherein the determination unit selects the change of the FOV in a case where it is determined that it is necessary to change the imaging condition after first estimation of the aliasing signal.
11. The magnetic resonance imaging apparatus according to claim 9,
wherein the determination unit selects the change of the weight of each channel in a case where it is determined that it is necessary to change the imaging condition after first estimation of the aliasing signal.
12. The magnetic resonance imaging apparatus according to claim 1,

wherein the FOV change unit sets the FOV in the phase encoding direction to be large based on an aliasing signal range estimated by the aliasing signal range estimation unit.

13. The magnetic resonance imaging apparatus according to claim 1, wherein the channel weighting amount calculation unit calculates the weighting amount such that a signal outside the set FOV is small and a signal inside the FOV is large.

14. The magnetic resonance imaging apparatus according to claim 1, wherein the reconstruction unit reconstructs an image by weighted-averaging the nuclear magnetic resonance signals received by the channels of the reception coil by using the weights of the channels finally set by the imaging condition setting unit.

15. The magnetic resonance imaging apparatus according to claim 1, wherein the reconstruction unit reconstructs an image by combining the nuclear magnetic resonance signals received by the channels of the reception coil by using the weights of the channels finally set by the imaging condition setting unit and a sensitivity distribution of the channels.

16. A method performed by a magnetic resonance imaging apparatus, for supporting setting of an imaging condition of the magnetic resonance imaging apparatus, the method by the magnetic resonance imaging apparatus comprising:

estimating by the magnetic resonance imaging apparatus a range in which an aliasing signal occurs, based on a FOV set at the beginning, by the magnetic resonance imaging apparatus using a positioning image;

determining by the magnetic resonance imaging apparatus whether it is necessary to perform a change of an imaging condition based on an estimation result; and performing by the magnetic resonance imaging apparatus at least one of a change of the FOV or a change of a weight of each channel of a reception coil of the magnetic resonance imaging apparatus in a case where it is determined the magnetic resonance imaging apparatus determines that the change of the imaging condition is necessary.

17. The method of supporting setting of an imaging condition of a magnetic resonance imaging apparatus according to claim 16, wherein, after any one of the change of the FOV or the change of the weight of each channel is performed, re-estimation of the range in which the aliasing signal occurs based on a changed condition and execution of at least one of the change of the FOV or the change of the weight of each channel of the reception coil of the magnetic resonance imaging apparatus are repeated.

18. The method of supporting setting of an imaging condition of a magnetic resonance imaging apparatus according to claim 17, wherein, in a first repetition, one of the change of the FOV or the change of the weight of each channel is performed, and in a second repetition, the other is performed.

* * * * *